United States Patent
Yamamoto et al.

(10) Patent No.: US 8,471,438 B2
(45) Date of Patent: Jun. 25, 2013

(54) ACTUATOR WITH SENSOR

(75) Inventors: Jun Yamamoto, Tokyo (JP); Sotomitsu Ikeda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 22 days.

(21) Appl. No.: 12/839,304

(22) Filed: Jul. 19, 2010

(65) Prior Publication Data

US 2011/0050040 A1 Mar. 3, 2011

(30) Foreign Application Priority Data

Aug. 27, 2009 (JP) .................. 2009-197416

(51) Int. Cl.
*H01L 41/08* (2006.01)

(52) U.S. Cl.
CPC ................... *H01L 41/0825* (2013.01)
USPC .......................................... 310/338; 310/328

(58) Field of Classification Search
CPC ..... H01L 41/053; H01L 41/0825; H01L 41/09; H01L 41/0926; H01L 41/0933; H01L 41/113; H01L 41/1132; H01L 41/1134
USPC .................................................. 310/328, 338
See application file for complete search history.

(56) References Cited

U.S. PATENT DOCUMENTS

| 6,191,519 | B1* | 2/2001 | Nye et al. ................. 310/316.01 |
| 7,948,151 | B1* | 5/2011 | Blackburn et al. ............ 310/328 |
| 2006/0158065 | A1* | 7/2006 | Pelrine et al. ................. 310/328 |
| 2008/0284277 | A1* | 11/2008 | Kwon et al. .................. 310/309 |
| 2009/0085444 | A1* | 4/2009 | Alvarez Icaza Rivera et al. ............................. 310/365 |

FOREIGN PATENT DOCUMENTS

| JP | 11-093827 A | 4/1999 |
| JP | 2006-129541 A | 5/2006 |
| JP | 2008-038660 A | 2/2008 |

OTHER PUBLICATIONS

"High performance fully plastic actuator based on ionic-liquid-based bucky gel" by Ken Mukai, Kinji Asaka, Kenji Kiyohara, Takushi Sugino, Ichiro Takeuchi, Takanori Fukushima, and Takuzo Aida, Electrochimica Acta 53 (2008), pp. 5555-5562.

* cited by examiner

*Primary Examiner* — Derek Rosenau
(74) *Attorney, Agent, or Firm* — Canon USA, Inc., IP Division

(57) ABSTRACT

An actuator with a sensor, including an actuator having electrodes and an ionic conduction layer, a sensor and a rigid body member provided in contact with the sensor. The actuator is connected to the sensor through the rigid body member such that the sensor is not deformed attending on deformation of the actuator.

13 Claims, 3 Drawing Sheets

ACTUATOR WITH SENSOR

BACKGROUND OF THE INVENTION

1. Field of the Invention

The present invention relates to an actuator with a sensor for obtaining information on distance from or contact state with an object.

2. Description of the Related Art

In order to improve the controllability of an actuator, it is important to detect information on distance from or contact state with an object. Thus, a method of forming a sensor such as a tactile sensor on the side of an actuator facing an object has heretofore been adopted.

As an example where a polymer actuator is combined with a sensor, such a construction that electrodes are formed directly on an actuator has been known as disclosed in Japanese Patent Application Laid-Open No. 2006-129541. In Japanese Patent Application Laid-Open No. 2006-129541, two or more electrodes are arranged on a filmy surface of a conductive polymer actuator exhibiting a stretching action to detect a resistance value between the electrodes. This utilizes a phenomenon that the conductivity of a conductive polymer varies according to quantity of stretching and is an internal sensor for detecting driven quantity of the actuator. On the other hand, since the conductivity varies even in a case where displacement such as strain or bending is given to the actuator by contact with an object, it can be utilized as a sensor.

SUMMARY OF THE INVENTION

However, the above prior art example involves the following problem.

The sensor formed facing the polymer actuator receives such an action that a sensor forming surface is distorted by a shape change of the polymer actuator itself in addition to the strain by contact with an object. The sensor thereby changes the resistance value according to the strain of the sensor itself by contact with an object and also takes place a change in the resistance value even when the polymer actuator operates to cause strain on the sensor. In such a case, in the resistance value detected by the sensor, influences of both of the strain by contact with an object and the strain attending on the action of the polymer actuator are superimposed. Therefore, it is difficult to obtain precise information on contact state with an object.

In view of the above-described problem, the present invention provides an actuator with a sensor of the construction that an actuator is connected to a sensor for detecting contact state of the actuator with an object, wherein the influence of strain by the action of the actuator on the sensor can be reduced to improve the detection precision of the sensor.

In a first aspect of the present invention, there is provided an actuator with a sensor, comprising an actuator having electrodes and an ionic conduction layer, a sensor and a rigid body member provided in contact with the sensor, wherein the actuator is connected to the sensor through the rigid body member such that the sensor is not deformed attending on deformation of the actuator.

In a second aspect of the present invention, there is provided an actuator with a sensor, comprising an actuator having electrodes and an ionic conduction layer, a sensor and a rigid body member provided in contact with the sensor, wherein the actuator is connected to the sensor through the rigid body member, and the modulus of elasticity E of the rigid body member is $0.1 \text{ GPa} \leq E$.

According to the present invention, in the actuator with the sensor of the construction that the actuator is connected to the sensor for detecting contact state of the actuator with an object, the influence of strain by the action of the actuator on the sensor can be reduced to improve the detection precision of the sensor.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

The actuator with the sensor according to the present invention is an actuator with a sensor that has an actuator having electrodes and an ionic conduction layer, a sensor and a rigid body member provided in contact with the sensor, wherein the actuator is connected to the sensor through the rigid body member such that the sensor is not deformed attending on deformation of the actuator.

Actuators with a sensor according to embodiments of the present invention will now be described.

Figure 1A:
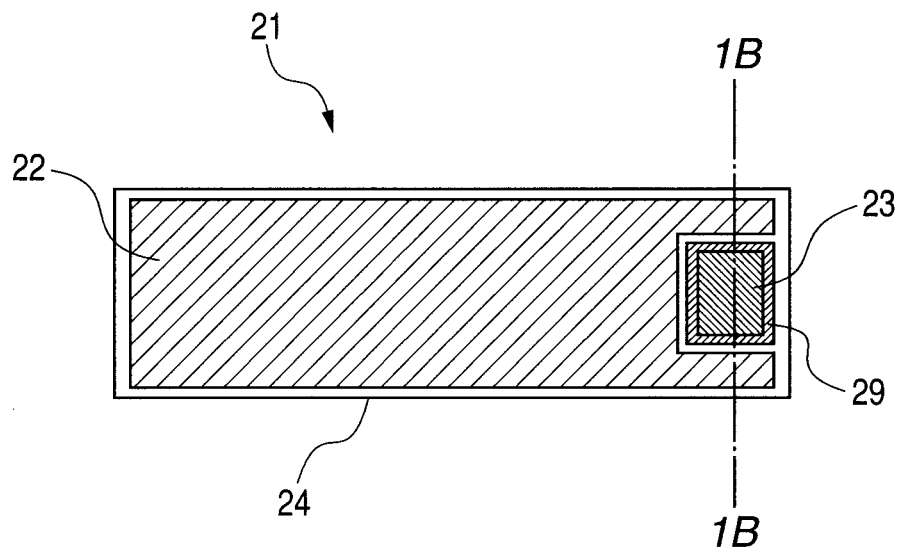
FIGS. 1A and 1B illustrate the construction of an actuator with a sensor according to an embodiment of the present invention.
Figure 1B:
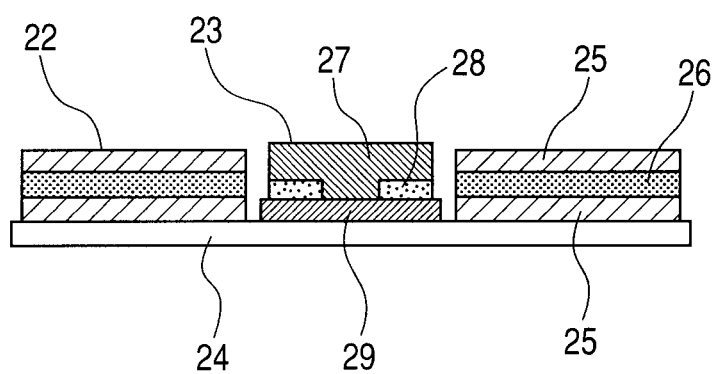

FIGS. 1A and 1B illustrate the construction of a actuator with a sensor according to an embodiment of the present invention, in which FIG. 1A is an illustration viewed from a side facing an object (not illustrated), and FIG. 1B is a cross-sectional view taken along line 1B-1B in FIG. 1A.

The actuator with the sensor according to this embodiment has an actuator having electrodes and an ionic conduction layer, a sensor and a rigid body member connected to the sensor. The actuator and the rigid body member connected to the sensor are provided on a frame so as to connect the actuator to the sensor. The rigid body member is arranged under a sensor forming surface so as not to exert the influence of strain or shape change of the actuator caused by the action of the actuator.

In FIGS. 1A and 1B, the actuator with the sensor 21 is constructed by an actuator 22, a sensor 23, a frame 24, an actuator electrodes 25, an ionic conduction layer 26, a sensor membrane 27, sensor electrodes 28, and a rigid body member 29.

Figure 2A:
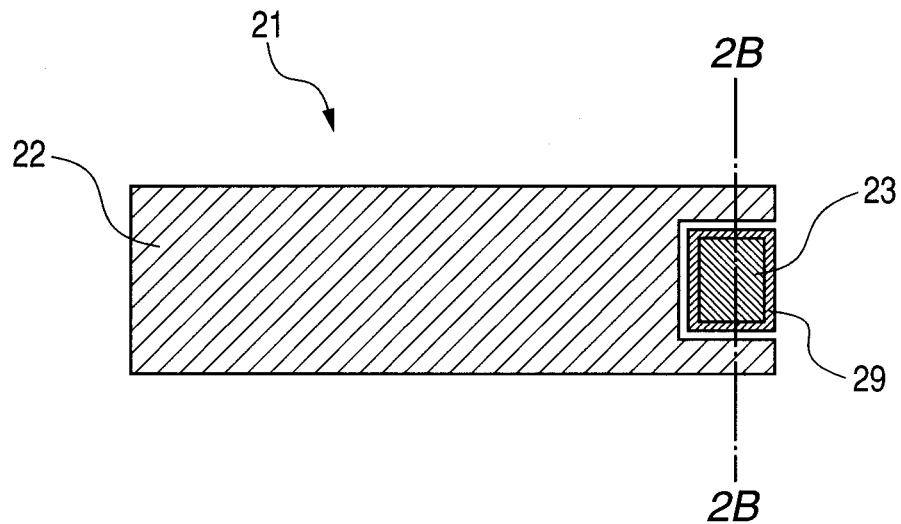
FIGS. 2A and 2B illustrate the construction of an actuator with a sensor according to another embodiment of the present invention.
Figure 2B:
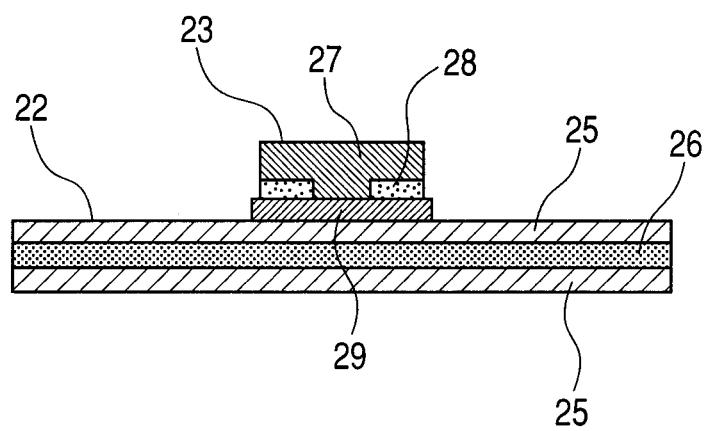

FIGS. 2A and 2B illustrate the construction of a actuator with a sensor according to another embodiment of the present invention. The actuator with the sensor illustrated in FIGS. 2A and 2B has an actuator having electrodes and an ionic conduction layer, a sensor and a rigid body member connected to the sensor. The actuator is connected directly to the rigid body member provided in contact with the sensor. Specifically, the rigid body member provided in contact with the sensor is provided on the actuator, and the actuator and the sensor are constructed so as to be laminated and connected to each other.

The actuator is connected to an external power source through a wiring (not illustrated), and the sensor is connected to an electric signal detection unit through a wiring (not illustrated).

In the present invention, the actuator 22 is a laminate formed of the ionic conduction layer 26 and the electrodes 25, and exhibits shape change such as bending as a whole by applying a potential difference between the electrodes by an external power source.

The sensor 23 changes the output of an electric signal between the sensor electrodes 28 according to that strain or shape change of the sensor membrane 27 formed of a flexible film which is caused by pressing force and the like. The sensor 23 detects distance from or contact state with an object and moreover serves as a part of a grip point for applying force to the object with respect to the action of the actuator.

The actuator 22 and the rigid body member 29 provided in contact with the sensor 23 are provided on the frame 24, and the sensor 23 is formed on the rigid body member 29. The rigid body member 29 is formed of a rigid material that is not distorted even by the shape change under the forming surface attending on the action of the actuator 22.

By adopting the above-described construction, the actuator is connected to the sensor through the rigid body member, whereby the strain of the sensor caused by the action of the actuator can be reduced, thereby greatly generating strain on the sensor only upon its contact with an object to improve the precision of information on the contact of the sensor with the object.

The respective materials and constructions of the actuator and sensor will hereinafter be described in detail.

Construction of Actuator

In the present invention, the actuator 22 is favorably a polymer actuator. An example where a polymer actuator is used as the actuator 22 (hereinafter also described as polymer actuator 22) will hereinafter be described. The polymer actuator 22 is an ion conductive actuator. Electrodes 25 containing a conductive material and an ionic substance are formed on both surfaces of an ionic conduction layer 26 containing an ionic substance. The respective layers have flexibility and are formed into a rectangle.

In the structure in which both electrodes are held so as to face each other as illustrated in FIGS. 1A and 1B, the whole actuator exhibits a bending action upon application of voltage. Designing the construction of the ionic conduction layer and the arrangement of the electrodes enables the actuator to exhibit a stretching or twisting action.

The polymer actuator 22 may selectively have any form such as a circular, triangular, elliptical or rod-like flat plate, film, cylinder, helix or coil form in addition to the form of the rectangular flat plate.

The polymer actuator 22 may have a composite structure composed of single or plural elements.

It is favorable that the major axis direction of the sensor electrode 28 is parallel to the major axis direction of the actuator 22 because such a structure makes hard to exert the influence of strain of the actuator on the sensor 23.

Components of Polymer Actuator

Typical materials for members making up the polymer actuator 22 will be described.

<Ionic Conduction Layer>

The ionic conduction layer 26 is formed of a flexible material containing an ionic substance, which is a nonionic polymeric compound containing an ionic substance or an ion conductive polymeric compound. In such a material, ion serves as a charge carrier when current is caused to flow by charge transfer under the electric field.

Examples of the nonionic polymeric compound include fluorine-containing polymers such as tetrafluoroethylene and polyvinylidene fluoride; polyolefin polymers such as polyethylene and polypropylene; polybutadiene compounds; polyurethane compounds such as elastomers and gels; silicone compounds; thermoplastic polystyrene; polyvinyl chloride; and polyethylene terephthalate.

These compounds may be used either singly or in any combination thereof, and may be functionalized or copolymerized with another polymer.

As examples of the ionic substance contained in these nonionic polymeric compounds, may be mentioned lithium fluoride, lithium bromide, sodium bromide, magnesium chloride, copper sulfate, sodium acetate, sodium oleate and sodium acetate.

As the ionic substance, an ionic liquid is favorably used because durability of action in the air is improved.

Here, the ionic liquid is also called an ordinary-temperature molten salt or simply a molten salt and is a salt exhibiting a molten state in a wide temperature range including ordinary temperature (room temperature), for example, a salt exhibiting a molten state at 0° C., favorably −20° C., more favorably −40° C. The ionic liquid favorably has high ionic conductivity.

Any of various publicly known salts may be used as the ionic liquid, and a cheap salt exhibiting a liquid state in an actual service temperature range is favorable. Favorable examples of the ionic liquid include imidazolium salts, pyridinium salts, ammonium salts and phosphonium salts. These salts may be used either singly or in any combination thereof.

As the ion conductive polymeric compound, may be used a polycation or polyanion. As examples of the polyanion, may be mentioned those obtained by introducing a sulfonic group ($-SO_3H$), carboxyl group ($-COOH$) or phosphoric group as an anionic functional group into a publicly known polymer having such a basic skeleton as polyethylene, polystyrene, polyimide or polyarylene (aromatic polymer); perfluorosulfonic polymers, perfluorocarboxylic polymers and perfluorophosphoric polymers obtained by introducing an anionic functional group such as a sulfonic group, carboxyl group or phosphoric group into a skeleton of a fluorine-containing polymer.

A perfluorosulfonic acid/PTFE (polytetrafluoro-ethylene) copolymer (Flemion (trademark, product of Asahi Glass Co., Ltd., or Nafion (trademark, product of Du Pont Co.)) may be favorably used.

As examples of the polycation, may be mentioned those obtained by introducing a sulfonium group, ammonium group or pyridinium group as a cationic functional group into a publicly known polymer such as polyethylene, polystyrene, polyimide or polyarylene (aromatic polymer).

These ion conductive polymeric compounds are required to be in a water-containing state at the time a voltage is applied to cause movement. The state may also be a state of containing an ionic liquid in place of water.

When the ion conductive polymeric compound is a polyanion, the counter cation of the anionic functional group is favorably replaced with $Li^+$, $Na^+$, $K^+$ or alkylammonium ions.

When the ion conductive polymeric compound is a polycation, the counter anion of the cationic functional group is favorably replaced with $F^-$, $Cl^-$, $Br^-$, an aromatic or aliphatic sulfone, an aromatic or aliphatic carboxylic acid, or an aromatic or aliphatic phosphoric acid.

<Electrode>

The electrodes 25 are flexible electrodes formed of a composite of a conductive material and a polymeric material (polymer binder), or flexible thin-layer electrodes formed of a conductive material.

No particular limitation is imposed on the conductive material so far as actuator performance is not adversely affected. However, examples thereof include various kinds of carbon materials such as graphite, carbon black, carbon whiskers, carbon fibers, carbon nanotubes and carbon microcoils; powders (fine particles) of metals (gold, platinum, palladium, ruthenium, silver, iron, cobalt, nickel, copper, titanium and aluminum); metallic compounds (tin oxide, zinc oxide, indium oxide and ITO); metallic fibers; conductive ceramic materials; and conductive polymer materials. The electrode layer contains one of these conductive materials or a mixture thereof.

Among these, carbon materials having a nano-structure are favorable from the viewpoints of conductivity and specific surface area, and carbon nanotubes (CNTs) are particularly favorable. CNT gels formed from a carbon nanotube and an ionic liquid is extremely favorable as a electrode material because it has such an advantage that a bundle of the nanotube is gelled by self-organization with the ionic liquid to effectively disperse CNT.

No particular limitation is imposed on the polymer binder contained in the electrode 25 so far as it has sufficient flexibility to follow the action of the actuator. However, the binder favorably has a low hydrolyzability and is stable in the air.

As the material for such a polymer binder, may be used any of the materials mentioned for the ionic conduction layer. A conductive polymer may also be used. No particular limitation is imposed on such a polymer. However, as examples thereof, may be mentioned polyaniline, polypyrrole, polythiophene, polyacetylene and polyphenylene.

Incidentally, these materials may be used either singly or in any combination thereof, and may be functionalized or copolymerized with another polymer. The polymer binder is favorably a polymer having high compatibility with the ionic conduction layer 26. High compatibility and bonding ability with respect to the ionic conduction layer 26 permit formation of an electrode 25 that is firmly and closely bonded. For this reason, the polymer binder is favorably a polymer having a polymer structure that is the same as, similar to or identical to that of the polymeric compound forming the ionic conduction layer 26, or a polymer having a functional group that is the same as, similar to or identical to that of the polymeric compound forming the ionic conduction layer 26.

The electrode 25 may be formed as a thin metal layer by plating, vapor deposition or sputtering. When such an electrode is formed directly on the ionic conduction layer, the electrode 25 may be regarded as being formed of a conductive material alone. Such a thin metal layer can contribute to improvement in conductivity in an in-plane direction of the electrode.

Production Process of Actuator

No particular limitation is imposed on a production process of the ionic conduction layer 26 used in the present invention. An example where the ionic conduction layer 26 is formed of a nonionic polymeric compound and an ionic liquid is described. Examples of a process for producing such an ionic conduction layer include a process in which an ionic liquid and a polymer component are mechanically kneaded under heat and then formed; a process in which after an ionic liquid and a polymer component are dissolved in a proper solvent, the solvent is removed, and the remainder is then formed; a process in which a polymer component is impregnated with an ionic liquid, and the resultant impregnated product is then formed; and a process in which a monomer used in preparation of a polymer component is caused to react in the presence of a polymerization initiator, and the resultant reaction product is then formed. The production process may be suitably selected from these processes in accordance with end applications intended.

As the solvent in the process in which after the ionic liquid and the polymer component are dissolved in the proper solvent, the solvent is removed, may be used, for example, tetrahydrofuran (THF), methyl ethyl ketone, N-methyl-2-pyrrolidone or dimethylacetamide (DMAc).

No particular limitation is also imposed on a production process of the electrode 25 used in the present invention. For example, the electrode 25 can be formed in the same manner as that for the ionic conduction layer except that a conductive material is added in forming the ionic conduction layer 26.

The ionic conduction layer 26 and electrodes 25 thus obtained may be uniformly cut into any shape and size. No particular limitation is imposed on a process for forming the polymer actuator 22. However, a process in which the electrodes 25 are arranged on both side of the ionic conduction layer 26 so as to hold the ionic conduction layer between the electrodes followed by subjecting them to heat-pressing (hot-pressing or heat-bonding under pressure), may favorably be used.

No particular limitation is imposed on the temperature, pressing pressure and time in the heat pressing so far as the temperature is lower than a decomposition temperature of the polymer binder, and these conditions may be suitably selected according to the polymer binder used, the polymeric compound forming the actuator and the kind of the ion transferred. For example, the temperature of the heat pressing is favorably from 30 to 150° C. The pressing pressure is favorably from 1 to 100 kg/cm$^2$, more favorably from 10 to 50 kg/cm$^2$.

A process in which thin metal layers are formed on both surfaces of the ionic conduction layer 26 by plating, vapor deposition or sputtering may also be adopted.

When water, an ionic substance, an ionic liquid or a mixture thereof is caused to be contained in the polymer actuator 22 after the production of a device, it is only necessary to impregnate the polymer actuator with such a solution thereof. Here, no particular limitation is imposed on the concentration of the solution impregnated and impregnation time, and any conventionally known method may be used.

Driving of Polymer Actuator

Both electrodes on the polymer actuator 22 are connected to an external power source through a lead wire (not illustrated). The external power source applies a voltage or current between the electrodes of the polymer actuator 22 to give a potential difference, thereby bringing about a shape change on the polymer actuator 22.

In the ion conductive polymer actuator having an electrode/ionic conduction layer/electrode structure, a volume difference occurs between the two electrodes resulting from the interlayer transfer of the ion conductor caused by the potential difference. In the case of containing, for example, an ionic liquid, an anion and a cation making up the ionic liquid are attracted to a plus electrode and a minus electrode, respectively. These anion and cation are different in ion size from each other, and this difference in ion size is one of the causes for the volume difference between the electrodes.

The whole polymer actuator comes to exhibit such bending motion as to become flexed toward one of the electrodes attending on such a change in shape or volume between the electrodes.

Since the transfer quantity and transfer speed of the ion conductor vary according to the value of a voltage Or current applied between both electrodes, the displacement quantity and displacement speed in the bending motion of the polymer actuator can be controlled by electrical control. The direction of the bending motion can also be controlled by changing the polarity of the voltage applied or the direction of the current.

In the ion conductive type polymer actuator, a bending action can be conducted by applying a low voltage of the order of from 0.1 to 10 V between both electrodes. In the case of using an ionic liquid, deterioration can be inhibited by applying a voltage within a range not exceeding the potential window of the ionic liquid. In the case of using a general ionic liquid, the voltage applied is favorably 4 V or less.

The external power source applies a direct voltage (current) or an alternating voltage (current) to the polymer actuator 22. Input of these electric signals can be application with a constant value, linear sweeping, or any waveform such as square wave or sine wave. It may also be possible to control the reference or amplitude of the signal. Further, the input time of the signal and the duty cycle of the signal waveform may be arbitrarily set. In addition, such a change-over unit on a circuit as to change the polarity of an electrode and a short-circuit unit for short-circuiting between electrodes may be provided.

The external power source has such a control mechanism as to obtain information on distance from or contact state with an object from the sensor 23 to suitably change the input signal to the polymer actuator 22 based on the information. It is thereby possible to conduct a more soft and compatible action based on an action between the actuator with the sensor and the object.

An internal sensor for detecting information on the displacement or position of the polymer actuator 22 may be provided in the actuator with the sensor separately from the sensor 23.

The external power source may have such a control mechanism as to suitably change the input signal to the polymer actuator 22 based on the information on the displacement or position of the polymer actuator 22 detected by the internal sensor.

This internal sensor follows the action of the polymer actuator 22 to cause a shape change such as strain or flexure on itself, thereby changing output of an electric signal. The internal sensor may be formed of the same material as that of the sensor 23 and may be so constructed that a change in resistance or impedance is detected, or may be formed of the same material as the polymer actuator and may be so constructed that a change in electromotive force is detected.

Characteristics of Polymer Actuator

Since the polymer actuator is formed of a flexible material, the modulus of elasticity value of the material generally used is as low as 300 MPa or less.

A tensile and compression testing machine (MST-1) manufactured by Shimadzu Corporation is used to calculate modulus of elasticity according to the following expression (1) from the relationship between strain ($\in$) [mm/mm] of a film and tensile force ($\delta$) [MPa] per cross-sectional area of the film. The modulus of elasticity is calculated as a gradient of a straight line portion in a strain-tensile force curve.

$$E = \delta/\in \qquad \text{Expression (1)}$$

For example, an actuator used in Examples 1 to 6, which will be described later, formed of an ionic conduction layer obtained by filling 1-butyl-3-methylimidazolium tetrafluoroborate (BMIBF4), which is an ionic liquid, into a base material composed of a polyvinylidene fluoride-hexafluoropropylene copolymer (PVDF(HFP)) and electrodes obtained by mixing carbon nanotubes in the ionic conduction layer exhibited a modulus of elasticity of from 10 MPa to 100 MPa. This value is almost equivalent to the value described in literatures as the modulus of elasticity of a polymer actuator.

When a pushing pressure (bending force) by bending motion of the polymer actuator was measured by a load cell UL-10GL manufactured by Minebea Co., Ltd., it was about 50 mN at the maximum in application of a voltage up to 4 V. When strain force generated in the polymer actuator was calculated with reference to the literature (Electrochimca Acta 53 (2008), 5555-5562), it was about 5 MPa. The force generated by a conductive polymer high actuator has been reported to be generally up to several tens MPa.

Components of Sensor

Typical materials for members making up the sensor 23 will be described.

In the present invention, the sensor 23 has a sensor membrane 27 and two electrodes 28 arranged on the sensor membrane 27. The sensor 23 may be any sensor so far as it can output a change of an electric signal against input of displacement.

In order to come into soft contact with an object, as favorable examples of the sensor membrane 27, may be mentioned pressure-sensitive conductive rubbers obtained by mixing a conductive material such as carbon or a metal in a flexible polymeric base material such as acrylic rubber, acrylonitrile-butadiene rubber, isoprene rubber, urethane rubber, ethylene-propylene rubber, epichlorohydrin rubber, chloroprene rubber, silicone rubber, styrene-butadiene rubber, butadiene rubber, fluororubber or polyisobutylene rubber. Since the sensor is formed of a flexible material, the modulus of elasticity thereof is lower than the modulus of elasticity of the actuator.

No particular limitation is imposed on the conductive material so far as sensor performance is not adversely affected. Examples thereof include various kinds of carbon materials, such as graphite, carbon black, carbon whiskers, carbon fibers, carbon nanotubes and carbon microcoils; powders (fine particles) of metals (gold, platinum, palladium, ruthenium, silver, iron, cobalt, nickel, copper, titanium and aluminum); metallic compounds (tin oxide, zinc oxide, indium oxide and ITO); metallic fibers; conductive ceramic materials; and conductive polymer materials. The sensor membrane contains one material or a mixture of two or more materials thereof.

The sensor detects a change in mutual distance of the conductive material in the membrane or the contact state thereof when the sensor membrane is distorted. In order to detect a change in impedance to such a phenomenon, the content of the conductive material is favorably of the order of from 1% by weight to 20% by weight.

The sensor electrodes 28 are formed so as to contain a conductive material, such as a metallic material such as SUS, gold, platinum, silver, copper or aluminum, or a carbon material.

The sensor electrodes 28 may be arranged so as to hold the sensor membrane 27 between them or may be arranged side by side on one side of the membrane. Since the sensor 23 is desired to exhibit flexibility on the side facing an object, it is favorable that the sensor membrane 27 is exposed to a side facing the object, and the sensor electrodes 28 are formed in the interior of the sensor membrane 27 or on the side opposite to the side facing the object. Alternatively, the electrodes 28 may be exposed to the side facing the object, and another flexible film layer may be formed thereon.

Two or more electrodes 28 are provided on the sensor membrane 27 formed of the pressure-sensitive conductive rubber and connected to an electric signal detection unit through a lead wire (not illustrated). The electric signal detection unit detects an electric output change between the electrodes holding the sensor membrane 27 of the sensor 23 between them. For such a sensor, the electric signal detection unit may be equipped with a mechanism for measuring direct-current resistance from acquirement of a direct current (voltage) to application of a direct voltage (current), or may be equipped with a mechanism for measuring impedance from acquirement of an alternating current (voltage) to application of an alternating voltage (current). The unit may also be equipped with a mechanism capable of applying an arbitrary alternating frequency for the measurement of the impedance.

When the base material of the sensor formed of the pressure-sensitive conductive rubber is deformed by contact with an object, distance or adhesion between conductive particles in the interior thereof or the shape of the conductive particles is changed. The output value of an electric signal in the sensor element is thereby changed, and so information on contact state with the object can be obtained.

When the sensor is distorted by the contact with the object, resistance component (R) is generally increased. In addition to the resistance component, capacitor component (capacitance C) is also changed. When a coiled substance is contained in the interior, a coil component (reactance L) is changed with respect to extension of the coiled substance. The overall change of the impedance with respect to the changes of these respective components L, C and R permits detecting the contact state.

Since the L and C components have such a nature that their values are changed according to distance between the sensor and the object upon application of an alternative current, the sensor can also be utilized as a proximity sensor. As such a sensor, is known a sensor in the interior of which fine coils formed of a metal or carbon are contained.

Driving of Sensor

Both electrodes 28 of the sensor 23 are connected to the electric signal detection unit through a lead wire (not illustrated). The electric signal detection unit detects impedance between the electrodes of the sensor 23.

A change in impedance by the strain of the sensor is detected as a combined value of the respective components L, C and R. In order to obtain these L, C and R components, it is favorable to obtain alternating impedance from Hz to GHz, favorably from kHz to MHz. The respective components L, C and R included in the impedance can be separated taking an equivalent circuit into consideration.

When occurrence of strain of the sensor is caused by action on the object, the contact state can be distinguished by detecting an impedance value. Information on distance from the object can also be obtained by utilizing the L or C component.

The electric signal detection unit may be so constructed as to detect change of R in application of a direct current as well as the alternating current.

The electric signal detection unit obtains information on distance from or contact state with an object from the sensor and feeds back the information into the external power source controlling the action of the polymer actuator.

Connection of Actuator to Sensor

The polymer actuator 22 is connected to the sensor 23 through the frame 24 to provide an integral construction. The frame 24 may be formed of any material such as a plastic or polymer film, or a metal film. However, the film is favorably such a flexible film that the action of the polymer actuator 22 is not prevented. For example, when the modulus of elasticity of the polymer actuator is from about 10 MPa to 100 MPa, the frame favorably has a modulus of elasticity near thereto. Connection of the frame 24 to the polymer actuator 22 and the sensor 23 may be made by any of various methods such as thermo-compression bonding, adhesion and lamination.

A rigid body member 29 that prevents the sensor from being affected by strain upon the action of the polymer actuator is arranged at a connecting surface between the frame 24 and the sensor 23.

Since the resistance component R of the sensor is attributed to strain or shape change of the sensor membrane 27, it is not favorable to cause another strain or shape change than that by the contact with the object. When another strain or shape change than that by the contact with the object is generated to change R, the overall impedance is changed to cause such problems that changes of C and L are hidden. Therefore, detection of not only contact state but also proximity state becomes inaccurate. On the other hand, since the sensor membrane 27 is formed connectively to the polymer actuator 22, it is easy to undergo the influence of strain or flexure upon the action of the polymer actuator. The rigid body member 29 serves to reduce the shape change of the sensor attending on the action of the polymer actuator 22.

The rigid body member 29 may be formed of any material such as a metal or plastic. However, the member is formed of a rigid material causing no strain against the force generated by the polymer actuator. The term "causing no strain" means that an error of ±20% or more in sensor output is not given.

Since the maximum force generated by the polymer actuator 22 is several tens MPa, the rigid body member 29 is required to be formed of a material causing no strain against the force generated. Therefore, the modulus of elasticity E of the rigid body member is desirably $0.1\ \mathrm{GPa} \leq E$, favorably $0.1\ \mathrm{GPa} \leq E \leq 100\ \mathrm{GPa}$. Materials exhibiting the value of this modulus of elasticity E include materials such as general-purpose plastics, engineering plastics and super engineering plastics, which are applicable to the rigid body member.

The rigid body member 29 favorably has an insulating structure as a whole for electrically isolating the sensor 23 from the polymer actuator 22. Therefore, the resistivity $\rho$ of the rigid body member is desirably $10^8\ \Omega\mathrm{m} \leq \rho$, favorably $1.0^{12}\ \Omega\mathrm{m} \leq \rho \leq 1.0^{17}\ \Omega\mathrm{m}$. The characteristics of the above-described plastic materials may cover the vale of the resistivity $\rho$.

The rigid body member 29 may be formed of such a material as to reduce various influences caused by arrangement of the sensor 23 in the vicinity of the polymer actuator 22. Examples of these influences include noise contamination into the sensor upon variations of electrode potential of the polymer actuator, influence of a parasitic capacity caused between the electrodes of the polymer actuator and the sensor, and influence of Joule heat generated in the polymer actuator. All of them form the factors of noises and drifts in the detection of L, C and R components.

Therefore, the dielectric constant $\in r$ of the rigid body member 29 is desirably $1 \leq \in r \leq 5$, favorably $2 \leq \in r \leq 4$ because the dielectric constant (in Chronological Scientific Table) of the rubber material used for the sensor membrane 27 of the sensor is about 8 for silicone rubber, about 2.4 for natural rubber and about 6.5 for neoprene rubber. It is necessary for the rigid body member 29 to have a dielectric constant of at least a value smaller than that of such a material for the sensor membrane.

The thermal conductivity $\lambda$ of the rigid body member 29 is desirably $\lambda \leq 5\ \mathrm{W}/(\mathrm{m \cdot K})$, favorably $0.1\ \mathrm{W}/(\mathrm{m \cdot K}) \leq \lambda \leq 1\ \mathrm{W}/(\mathrm{m \cdot K})$. This value is a smaller value than those of various kinds of metallic materials and covers characteristic of materials such as general-purpose plastics, engineering plastics and super engineering plastics, which are applicable to the rigid body member. Since the thermal conductivity of a general plastic is from 0.1 W/(m·K) to 0.3 W/(m·K), the thermal conductivity λ of the rigid body member is favorably 0.1 W/(m·K)≦λ≦0.3 W/(m·K).

The material of the rigid body member according to the present invention favorably satisfies at least one of the above-described various requirements, and examples of such a material include general-purpose plastics such as polyethylene, polypropylene, polyvinyl chloride, polystyrene, polyvinyl acetate, Teflon (trademark), ABS resins, AS resins and acrylic resins; engineering plastics such as polyamide, polyacetal, polycarbonate, polybutylene terephthalate and polyethylene terephthalate; super engineering plastics such as poly(phenylene sulfide), polytetrafluoroethylene, polysulfone, poly(ether sulfone), poly(ether ether ketone) and polyamide-imide; and fiber-reinforced plastics with glass fiber or carbon fiber incorporated into these materials. The material may also be a metal oxide such as silica or alumina, or a metal carbide such as silicon carbide.

The rigid body member is formed into a hollow, porous or three-dimensional network structure, whereby the modulus of elasticity, dielectric constant and thermal conductivity thereof can be controlled. In other words, when air is present in the interior of the structure without being filled with any material, the influence of the parasitic capacity can be reduced because air is a low-dielectric constant substance. When a metallic material is filled in the interior of the structure, the influence of an electric field variation attending on the driving of the polymer actuator is reduced because the metal plays a role of shields, and the strength of the rigid body member can be more enhanced. When a material lower in dielectric constant than that of the rigid body member or a material lower in thermal conductivity than that of the rigid body member is filled, the influence of the parasitic capacity and the influence of thermal drift can be reduced. These metallic material, low-dielectric constant material and low-thermal conductivity material are filled in any combination thereof, whereby various influences exerted on the sensor can be reduced by one rigid body member.

It is only necessary for such a rigid body member 29 to be arranged on at least a part of the surface of the sensor wherein the member may be stuck out of the surface.

The polymer actuator 22 and the sensor 23 are arranged through the frame 24 or the rigid body member 29, whereby a parallel arrangement in which they are planarly arranged can be adopted, or various constructions such as laminated arrangement in which they are laminated may also be adopted. When the sensor is formed directly on the surface of the polymer actuator, the frame may not be provided. in this case, the rigid body member 29 has the function of the frame as well to connect the polymer actuator to the sensor.

The polymer actuator 22 and the sensor 23 may selectively have any form such as a circular, triangular, elliptical or rod-like flat plate, film, cylinder, helix or coil form in addition to the form of the rectangular flat plate within the above-described constructional range.

The ratio in size between the polymer actuator 22 and the sensor 23 may be arbitrarily selected. In order to more improve the action efficiency of the polymer actuator 22, it is favorable to make the size of the sensor 23 relatively small.

The polymer actuator 22 and the sensor 23 may respectively adopt a composite structure composed of single or plural elements.

EXAMPLES

Examples in embodiments of the present invention will hereinafter be described in more detail.

Example 1

FIGS. 2A and 2B illustrate the construction of an actuator with a sensor in this example, in which FIG. 2A is an illustration viewed from a side facing an object, and FIG. 2B is a cross-sectional view taken along line 2B-2B in FIG. 2A.

The actuator with the sensor of this example is integrally constructed by forming a sensor 23 on a polymer actuator 22 composed of a laminate of an ionic conduction layer 26 and electrodes 25. In other words, the polymer actuator 22 and the sensor 23 adopt the construction of a laminated arrangement. A rigid body member 29 is arranged under a surface on which the sensor 23 is formed. A polyimide film (modulus of elasticity E=7 GPa) is used in the rigid body member 29.

By adopting the above-described construction, in the actuator with the sensor obtained by integrally forming the polymer actuator and the sensor detecting a contact state with an object, strain of the sensor caused by the action of the polymer actuator can be reduced, thereby greatly causing strain on the sensor only upon its contact with the object to improve the precision of information on the contact with the object.

Example 2

Figure 3A:
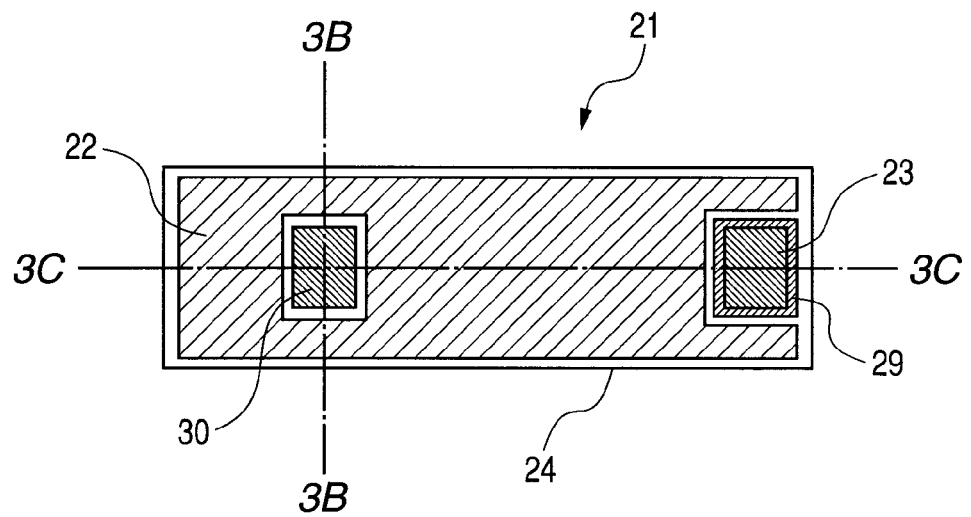
FIGS. 3A, 3B and 3C illustrate the construction of an actuator with a sensor according to a further embodiment of the present invention.
Figure 3B:
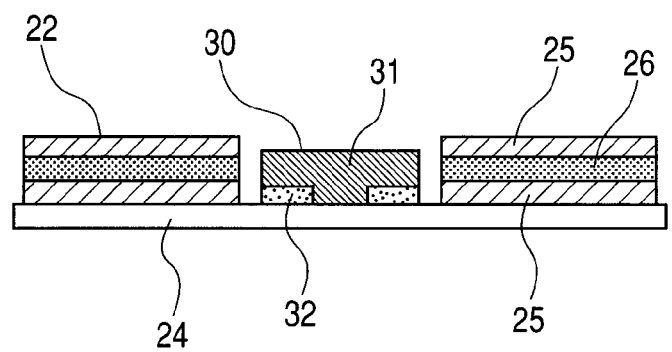
Figure 3C:
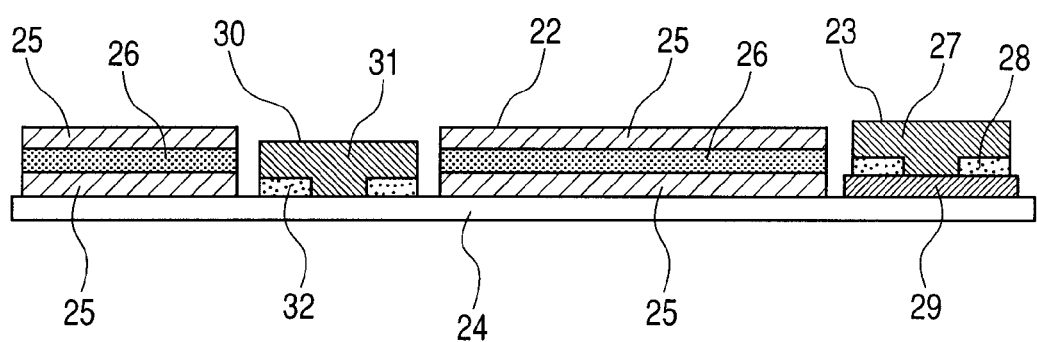

FIGS. 3A, 3B and 3C illustrate the construction of an actuator with a sensor of this example, in which FIG. 3A is an illustration viewed from a side facing an object, FIG. 3B is a cross-sectional view taken along line 3B to 3B in FIG. 3A, and FIG. 3C is a cross-sectional view taken along line 3C to 3C in FIG. 3A.

The actuator with the sensor of this example is integrally constructed by forming a sensor 23 on a polymer actuator 22 composed of a laminate of an ionic conduction layer 26 and electrodes 25, and a frame 24. A rigid body member 29 is arranged under a surface on which the sensor 23 is formed.

An internal sensor 30 is formed on t the polymer actuator 22. The rigid body member 29 is not arranged under a surface on which the internal sensor 30 is formed. The internal sensor 30 is such that two or more internal sensor electrodes 32 are arranged on the internal sensor membrane 31. The internal sensor membrane 31 is formed of the same material as that of an external sensor, for example, a pressure-sensitive conductive rubber obtained by dispersing carbon black in a resin composed of silicone rubber. The internal sensor electrodes 32 are formed of the same material as that of the external sensor electrodes, for example, Cu foil.

The internal sensor 30 serves to detect information on the displacement or position of the polymer actuator 22. Therefore, strain or flexure of the internal sensor itself desirably follows the action of the polymer actuator 22. Thus, the internal sensor 30 favorably has a flexibility comparable to that of the constituent member of the polymer actuator 22.

The internal sensor 30 is favorably formed keeping out of a grip point where the polymer actuator 22 and the object affect each other so as not to cause strain or flexure by the contact with the object.

As described above, the polymer actuator 22 comes to have in its plane a portion where strain or flexure is easily caused and a portion where strain or flexure is hardly caused. The internal sensor 30 is formed at the portion where strain or flexure is easily caused, while the sensor 23 is formed at the portion where train or flexure is hardly caused. The materials and construction of this example are the same as in Example 1 except for the internal sensor 30.

By adopting such construction, the internal sensor and the sensor having different functions can be opposed to each other while reducing mutual interference.

Example 3

The materials and construction of this example are the same as in Example 1 except that a shield member is formed in the rigid body member 29.

The shield member is a plate composed of a metal and provided for shielding the polymer actuator 22 from the influence of electric field.

There is a possibility that the sensor 23 may be greatly affected by an external electric field when the impedance is high. The sensor 23 is formed in the vicinity of the electrode 25 of the polymer actuator 22 or just above the electrode 25, and the electrode 25 changes the electrode potential within a range of several volts upon the action. When a substance having a potential different from the potential of the sensor 23 is present around it, an equivalent capacitor is formed by electrostatic coupling. When a variable component on the side of the polymer actuator is contaminated in the side of the sensor through this capacitor, noise is generated. It is thus necessary to reduce such influence for improving the precision of the sensor.

The shield member is such that a route (electric line of force) of the electric field is blocked by a metal plate, and the metal plate is connected to the ground or the like to fix the potential. A metallic material such as aluminum or iron is used for the shield member. In the case of shielding from the electric field, such a metallic material is effective even when its thickness is as thin as several tens μm. However, in a circuit high in impedance, the shield acts as a capacitor connected to the ground, and so the precision of the sensor 23 may be affected in some cases. Therefore, the shield member is favorably formed on the side of the polymer actuator so as to be distant from the sensor as much as possible. It is also favorable to arrange such a low-dielectric constant material as to lessen the influence of the parasitic capacity between the sensor 23 and the shield member as described in Example 4, which will be described later.

By adopting the above-described construction, in the actuator with the sensor obtained by integrally forming the polymer actuator and the sensor detecting contact state with an object, strain of the sensor caused by the action of the polymer actuator can be reduced, thereby greatly causing strain on the sensor only upon its contact with the object to improve the precision of information on the contact with the object.

In addition, noise contaminated in the sensor from the polymer actuator can be reduced, and so the detection precision of the sensor can be more improved.

Example 4

In this example, the construction is the same as in Example 1 except that a low-dielectric constant layer is formed on the rigid body member 29.

As also described in Example 3, in a circuit high in impedance, the shield acts as a capacitor connected to the ground, and so the precision of the sensor 23 may be affected in some cases. Likewise, it is necessary to take the influence due to formation of a capacitor with respect to the electrode 25 of the polymer actuator 22 into consideration.

The low-dielectric constant layer is a layer formed of a low-dielectric constant material for lessening the influence due to the formation of the capacitor as much as possible. As the low-dielectric constant material, may be used a generally known Low-k material. Examples thereof include $SiO_2$ and SiOC. Organic polymer type Low-k materials may be mentioned. When the low-dielectric constant material is rigid, the rigid body member 29 and the low-dielectric constant layer may be integrally formed.

From the viewpoint of utilizing air low in dielectric constant, the rigid body member 29 may have a large amount of pores. Examples of such structure of the rigid body member 29 include a structure having voids in the interior thereof, a porous structure and a three-dimensional network structure.

Such a structure in which a metallic material, which will become a shield member, is filled in the interior of the rigid body member 29 may also be adopted. A material having a dielectric constant lower than that of the rigid body member 29 may be filled.

By adopting the above-described construction, in the actuator with the sensor obtained by integrally forming the polymer actuator and the sensor detecting a contact state with an object, strain of the sensor caused by the action of the polymer actuator can be reduced, thereby greatly causing strain on the sensor only upon its contact with the object to improve the precision of information on the contact with the object.

In addition, noise contamination in the sensor from the polymer actuator can be reduced, and so the detection precision of the sensor can be more improved.

Example 5

In this example, the construction is the same as in Example 1 except that a low-thermal conductivity layer is formed on the rigid body member 29.

When output of the polymer actuator 22 is sufficiently great, it is supposed that the temperature of the polymer actuator 22 is raised by generation of Joule heat attending on output loss. When such heat is transferred to the sensor 23, it forms the cause of noise or drift.

The low-thermal conductivity layer is a layer formed of a low-thermal conductivity material for lessening the influence of such temperature as much as possible. Examples of the low-thermal conductivity material include inorganic fibers such as glass wool and rock wool, and foam plastics such as polystyrene and polyurethane. When the low-thermal conductivity material is rigid, the rigid body member 29 and the low-thermal conductivity layer may be integrally formed.

From the viewpoint of utilizing air relatively low in thermal conductivity, the rigid body member 29 may have a large amount of pores. Examples of such structure of the rigid body member 29 include a structure having voids in the interior thereof, a porous structure and a three-dimensional network structure.

A material having a thermal conductivity lower than that of the rigid body member 29 may be filled in the interior of the rigid body member 29. A shield material and a low-dielectric constant material may be filled.

By adopting the above-described construction, in the actuator with the sensor obtained by integrally forming the polymer actuator and the sensor detecting a contact state with an object, strain of the sensor caused by the action of the polymer actuator can be reduced, thereby greatly causing strain on the sensor only upon its contact with the object to improve the precision of information on the contact with the object.

In addition, noise contamination in the sensor from the polymer actuator or drift caused in the sensor can be reduced, and so the detection precision of the sensor can be more improved.

Example 6

In this example, the construction is the same as in Example 1 except that a frame 24 is formed.

The construction of the actuator with the sensor of this example is illustrated in FIGS. 1A and 1B.

The actuator with the sensor of this example is integrally constructed by forming a polymer actuator 22 composed of a laminate of an ionic conduction layer 26 and electrodes 25, and a sensor 23 on the frame 24. A rigid body member 29 is arranged under a surface on which the sensor 23 is formed.

The frame 24 is used for connection of the sensor 12 to the polymer actuator 22. A flexible polyethylene film that does not interfere with the action of the polymer actuator 22 is used as the frame 24.

In the integral construction of the polymer actuator 22 and the sensor 23, the rigid body member 29 is present under the sensor forming surface, thereby preventing strain or flexure under the sensor forming surface caused by the action of the polymer actuator from affecting the sensor.

By adopting the above-described construction, in the actuator with the sensor obtained by integrally forming the polymer actuator and the sensor detecting a contact state with an object, strain of the sensor caused by the action of the polymer actuator can be reduced, thereby greatly causing strain on the sensor only upon its contact with the object to improve the precision of information on the contact with the object.

Production processes of the actuators with the sensor of Examples 1 to 6 will hereinafter be described specifically.

The polymer actuator 22 is formed of an ionic conduction layer 26 obtained by filling 1-butyl-3-methylimidazolium tetrafluoroborate (BMIBF4), which is an ionic liquid, into a base material composed of a polyvinylidene fluoride-hexafluoropropylene copolymer (PVDF(HFP)), and electrodes obtained by mixing carbon nanotubes in the ionic conduction layer.

The ionic conduction layer 26 is formed according to the following procedure. 100 mg of PVDF(HFP) (product of Kanto Chemical Co., Inc.), which is the base material, 100 mg of BMIBF4 (product of Kanto Chemical Co., Inc.), which is the ionic liquid, and 1 mL of N,N-dimethylacetamide (DMAc) (product of Kishida Chemical Co., Ltd.), which is an organic solvent, were heated and mixed at 80° C. The resultant mixed solution was poured into a mold (thickness: 0.1 mm) composed of PTFE followed by leveling with a blade, and the product was then dried at room temperature to obtain an ionic conduction layer 26 having an even thickness.

The electrodes 25 are formed according to the following procedure. 50 mg of a single-layer nanotube (SWNT, product of Carbon Nanotechnology Incorporated, "HiPco"), which is a conductive material, 100 mg of ionic liquid (BMIBF4) and 1 mL of an organic solvent (DMAc) were put in a container.

Zirconia balls having a particle size of 2 mm were added into the container up to one third of the capacity of the container to conduct a dispersion treatment under conditions of 200 rpm and 30 minutes using a ball mill (planetary type pulverizer manufactured by Fritsch Co.). A solution prepared by dissolving 80 mg of PVDF(HFP), which is the base material, in 2 mL of DMAc under heat was then added to conduct an additional dispersion treatment under conditions of 500 rpm and 30 minutes.

The resultant mixed solution was poured into a mold (thickness: 0.05 mm) composed of PTFE followed by leveling with a blade, and the product was then dried at room temperature to obtain an electrode 25, in which the conductive material was uniformly dispersed, and which had an even thickness.

The ionic conduction layer 26 and the electrode were cut into an arbitrary size, and the ionic conduction layer and two electrodes were arranged so as to hold the central portion of the ionic conduction layer between the electrodes in such a manner that the two electrodes did not come into contact with each other, and they were heat-bonded under pressure under conditions of 80° C., 0.4 MPa and one minute to produce a polymer actuator. This polymer actuator conducts bending motion as a whole.

The sensor membrane 27 of the sensor 23 is formed of a pressure-sensitive conductive rubber obtained by dispersing carbon black in a resin composed of silicone rubber. Sensor electrodes 28 formed of copper foil are arranged side by side on one side of the pressure-sensitive conductive rubber, said side being opposite to a side facing an object.

The sensor membrane 27 is produced according to the following procedure. To 100 mg of a silicone resin (KE103, product of Shin-Etsu Chemical Co., Ltd.), which is a base material, were added 5 mg of carbon black and 5 mg of a hardener (CAT-103, product of Shin-Etsu Chemical Co., Ltd.), and the resultant mixture was stirred by a hybrid mixer and then centrifugally deaerated. In addition, the mixture was vacuum-deaerated by means of a vacuum dryer for removing fine bubbles. A mother liquor in which carbon black was uniformly dispersed was poured into a mold and hardened to form a sensor membrane 27. Upon the hardening, Cu foils were arranged side by side on one side of the sensor membrane, polyimide, which is a rigid body member 29, was further arranged thereon, and a cover was placed to conduct hardening while applying a load, thereby forming Cu electrodes 28 and a rigid body member 29 integrally with the sensor membrane. The modulus of elasticity E of the rigid body member 29 was 7 GPa.

The sensor fulfills a function of a sensor by detecting impedance to an alternating frequency from kHz to MHz.

Comparative Example 1

As a comparative example of the actuator with the sensor according to the present invention, may be mentioned such a construction that the rigid body member 29 is not arranged under the sensor forming surface in the construction of Example 6.

In this case, the sensor 23 is affected by strain or flexure caused by the action of the polymer actuator 22. In other words, the sensor is distorted by the action of the polymer actuator before the contact with an object, so that the output of impedance drifts. Since the impedance is in a drifted state in this manner, it is difficult to detect precise information.

INDUSTRIAL APPLICABILITY

An actuator with a sensor according to the present invention has such a construction that an actuator is connected to a sensor for detecting contact state of the actuator with an object, can reduce the influence of strain by the action of the actuator on the sensor to improve the detection precision of the sensor and is thus most suitable for use as an actuator of a robot coming into contact with human and is required to have flexibility and safety, a hand or manipulator for robots, a driving source for various machines, and actuators for medical and welfare robots such as surgical devices and assist suits as well as for micro-machines.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-197416, filed Aug. 27, 2009, which is hereby incorporated by reference herein in its entirety.

What is claimed is:

1. A medical and welfare robot to come into contact with a human through a surgical device, the medical and welfare robot comprising:
   an actuator with a sensor, wherein the actuator with a sensor includes:
   a rigid body member,
   a sensor provided in contact with the rigid body member, wherein the sensor is a tactile sensor that includes a sensor membrane configured to come into soft contact with an object, and
   an actuator connected to the sensor through the rigid body member, wherein the actuator includes electrodes and an ionic conduction layer,
   wherein, in response to deformation of the actuator, the rigid body member prevents the sensor from being deformed.

2. The medical and welfare robot according to claim 1, wherein the actuator is connected directly to the rigid body member provided in contact with the sensor such that the actuator along a major axis direction of the actuator and the sensor face one another through the rigid body member.

3. The medical and welfare robot according to claim 1, wherein the actuator and the rigid body member provided in contact with the sensor are provided on a frame such that the actuator along a major axis direction of the actuator and the sensor do not face one another.

4. The medical and welfare robot according to claim 1, wherein the rigid body member is configured as an insulating structure as a whole to electrically isolate the sensor from the actuator.

5. The medical and welfare robot according to claim 1, wherein the sensor membrane is made of a material and the rigid body member has a dielectric constant value that is smaller than a dielectric constant value of the material of the sensor membrane.

6. The medical and welfare robot according to claim 1, wherein the rigid body member includes an integrally formed low-thermal conductivity layer having a conductivity $\lambda$ of $\lambda \leq 5$ W/(m·K), whereby, in response to a temperature of the actuator being raised by generating a force, the low-thermal conductivity layer lessens the noise or drift influence of the temperature on the sensor.

7. The medical and welfare robot according to claim 1, wherein the actuator and the sensor are arranged in no contact with each other.

8. The medical and welfare robot according to claim 1, wherein the actuator and the sensor are respectively arranged on opposing two surfaces of the rigid body member.

9. The medical and welfare robot according to claim 1, wherein the actuator and the sensor are respectively arranged at different positions on a surface of the rigid body member.

10. The medical and welfare robot according to claim 1, wherein the sensor does not shape change by bending, on a dimension orthogonal to a major axis direction of the actuator, together with the actuator when the actuator is shape change by bending as a whole.

11. The medical and welfare robot according to claim 1, wherein, in response to the actuator exhibiting bending motion as to become flexed toward one of the electrodes, the sensor does not exhibit bending motion as to become flexed toward one of the electrodes together with the actuator.

12. The medical and welfare robot according to claim 1, wherein, in response to a shape change of the actuator itself, a sensor forming surface of the sensor provided in contact with the rigid body member is not distorted by the shape change of the actuator itself such that influence of a strain attending on a shape change action of the actuator is not superimposed in a resistance value detected by the sensor of a strain by contact with an object.

13. The medical and welfare robot according to claim 1, wherein the rigid body member is formed of a rigid material that is configured to cause no strain against force generated by the actuator, wherein no strain is determined to exist when an error of the sensor output due to a strain attending on a shape change action of the actuator is less than ±20%.

* * * * *